US006916400B2

(12) United States Patent
Moisan et al.

(10) Patent No.: US 6,916,400 B2
(45) Date of Patent: Jul. 12, 2005

(54) DEVICE FOR THE PLASMA TREATMENT OF GASES

(75) Inventors: Michel Moisan, Outremont (CA); Zakrzewski Zenon, Gdansk (PL); Danielle Keroack, St Jean sur Richelieu (CA); Jean-Christophe Rostaing, Versailles (FR)

(73) Assignee: L'Air Liquide Societe Anonyme a Directoire et Conseil de Surveillance pour l'Etude et l'Exploitation des Procedex Georges Claude, Paris (FR)

( * ) Notice: Subject to any disclaimer, the term of this patent is extended or adjusted under 35 U.S.C. 154(b) by 85 days.

(21) Appl. No.: 09/983,853

(22) Filed: Oct. 26, 2001

(65) Prior Publication Data

US 2002/0050323 A1 May 2, 2002

(30) Foreign Application Priority Data

Oct. 27, 2000 (FR) .............................. 00 13840

(51) Int. Cl.$^7$ ............................ H05H 1/00; C23C 16/00
(52) U.S. Cl. ............................ 156/345.41; 156/345.36; 156/345.42; 118/723 MW; 118/723 ME; 118/723 MR; 118/723 MA
(58) Field of Search .................. 156/345.41, 345.42, 156/345.36; 118/723 MW, 723 ME, 723 MR, 723 MA (56) References Cited

U.S. PATENT DOCUMENTS

| | | | | |
|---|---|---|---|---|
| 5,965,786 A | * | 10/1999 | Rostaing et al. | ............ 588/210 |
| 5,993,612 A | | 11/1999 | Rostaing et al. | |
| 6,190,510 B1 | | 2/2001 | Rostaing et al. | |
| 6,224,836 B1 | * | 5/2001 | Moisan et al. | .............. 422/186 |
| 6,290,918 B1 | | 9/2001 | Rostaing et al. | |
| 6,298,806 B1 | | 10/2001 | Moisan et al. | |

| | | |
|---|---|---|
| 6,541,917 B1 | 4/2003 | Rostaing et al. |

FOREIGN PATENT DOCUMENTS

| | | |
|---|---|---|
| EP | 0 104 109 A1 | 3/1994 |
| EP | 1 014 761 A1 | 6/2000 |
| FR | 2 757 082 | 6/1998 |

OTHER PUBLICATIONS

Moisan et al, "The Waveguide Surfatron: A High Power Surface–Wave Launcher to Sustain Large–Diameter Dense Plasma Columns;" *Journal of Physics e. Scientific Instruments*, vol. 20 (1987), pp. 1356–1361.
Database WPI, Section Ch. Week 199436, Derwent Publications Ltd., XP–002171377.
Moisan et al, "An atmospheric pressure waveguide–fed microwave plasma torch: the TIA Design;" *Plasma Sources, Science and Technology*, Nov. 1994, vol. 3, No. 4, pp. 584–592.
Bardos et al, "Microwave Surfatron System for Plasma Processing;" *Journal of Vacuum Science and Technology: Part A*, vol. 14, No. 2, Mar. 1996 pp. 474–477.
Search Report issued in Application No. FR 00 13840.

\* cited by examiner

*Primary Examiner*—P. Hassanzadad
*Assistant Examiner*—Ram N Kackar
(74) *Attorney, Agent, or Firm*—Burns, Doane, Swecker & Mathis, L.L.P.

(57) ABSTRACT

Provided is a device for the microwave-sustained plasma treatment of gases, which comprises a hollow structure forming a waveguide intended to be connected to a microwave generator, and means for making the gas to be treated flow through the said structure in a region in which the amplitude of the electric field associated with the incident wave is high. The means for making the gas flow comprise a plasma torch for producing a plasma in the gas. The torch comprises an injector made of an electrically conducting material mounted on a first large face of the said structure and extending so as to project through an orifice made in a second large face opposite the said first large face. A gap for passage of the incident waves lies around the injector.

38 Claims, 8 Drawing Sheets

DEVICE FOR THE PLASMA TREATMENT OF GASES

CROSS-REFERENCE TO RELATED APPLICATIONS

The present application claims priority to French Application No. 00 13840, filed Oct. 27, 2000, which is hereby incorporated by reference in its entirety.

BACKGROUND OF THE INVENTION

1. Field of the Invention

The present invention relates to a device for the plasma treatment of gases, in which the gas to be treated is excited by the plasma.

2. Description of Related Art

Devices for the plasma, especially microwave-sustained plasma, treatment of gases of this type generally comprise a hollow structure forming a waveguide intended to be connected to a microwave generator and means for making the gas to be treated flow through the said structure in a region in which the amplitude of the electric field associated with the incident wave is high, and preferably a maximum.

The principle of these gas treatment techniques consists in creating, by means of an electrical discharge in a majority gas or plasma gas (argon, nitrogen, krypton, xenon, etc.) containing impurities or gaseous effluents, a plasma within which the initial molecules are excited, ionized and dissociated into smaller fragments, atoms and radicals. Next, these species recombine and react together and/or with auxiliary gases to give new species which may be removed from the gas by conventional methods such as, for example, reactive adsorption. The molecules of the basic gas to be purified or decontaminated are, when they leave the plant, unchanged and in their ground state. For further details about the various devices enabling excited plasmas to be created, reference may be made for further details to the work entitled "*Microwave Excited Plasmas*" by M. Moisan and J. Pelletier, Elsevier, 1992.

The document U.S. Pat. No. 5,750,823 describes a device for the plasma treatment of a gas, which is used to excite the gas by sustaining in it an electrical discharge by means of an electric field associated with incident electromagnetic waves. The latter are excited by a field applicator which is formed by the hollow waveguide structure and is itself supplied with microwave power from a conventional waveguide, also formed by the hollow structure.

If the plasma is sustained by an electromagnetic surface wave, the field applicators used are of the surfatron-guide or surfa-guide type.

The means used for making the gas flow consist of a tube made of dielectric material in which the discharge is created.

Further examples of such gas treatment systems are described in the documents DE-A-4 428 418 and U.S. Pat. No. 5,300,202. These systems are operated at low pressure. The document EP-A 0 295 083 describes a device for the plasma treatment of gases, comprising a resonance cavity operating at atmospheric pressure.

These gas treatment devices, although advantageous in terms of conversion yield, energy efficiency and low operating sensitivity to variable operating conditions, have a major drawback in so far as they are ill-suited or not very suitable for the treatment of gases whose decomposition gives an appreciable amount of solid materials, generally in powder form.

This is because these materials may block the tube through which the gas to be treated flows and in which the discharge is created, or, at the very least, they may modify its initially optimized internal geometry, interfere with heat exchange and impede the cooling of the tube, or may even impair the dielectric properties of the latter and disturb the propagation of the surface wave.

To alleviate this drawback, it is possible to use a gas treatment device in which the gas is converted into a plasma, not in a confined tubular space, but in a relatively open volume spatially separated from the waveguide. In this case, one of the possible arrangements is that of a plasma torch supported and supplied by the waveguide. A torch suffers from none of the aforementioned drawbacks caused by the potential formation of solid deposits, in so far as the plasma does not form in the gas feed line for the torch but downstream of the latter, at the end of the torch nozzle.

To produce a gas treatment device, the free end of the torch, at which the plasma forms, emerges in a chamber which has the main function of collecting, in a sealed manner, the gases after treatment in the plasma and to receive the solid deposits produced by the treatment. The gases thus collected are then sent to a discharge line. Thereafter, they can be used as they are, or can undergo a post-treatment, or else can be discharged into the atmosphere.

A known example of such a microwave plasma torch is the "axial injection torch" (AIT). Such a torch is described, for example, in the article "*An atmospheric pressure waveguide-fed microwave plasma torch*" (Plasma Sources Sci. Technol. 3 (1994) pages 584 to 592) or in Certificate of Addition Application FR-A-2 533 397. The AIT torch has been applied to the destruction of $SF_6$ and $C_2F_6$. However, its architecture is relatively sophisticated and its construction is quite complex and expensive. In addition, it is intrinsically difficult to provide the gas circuit with very good sealing. This is a very serious drawback in the case of the treatment of gases containing impurities or effluents whose conversion gives dangerous gases (for example, corrosive halogenated compounds) or else gases of high added value (krypton and xenon). Finally, the length of the feed channel for the AIT nozzle is quite long. This may pose impurity recondensation problems.

It is an object of the invention to alleviate these drawbacks.

SUMMARY OF THE INVENTION

The subject of the invention is therefore a device for the plasma treatment of gases, of the aforementioned type, characterized in that the means for making the gas flow comprise at least one plasma torch for producing, at the exit of the latter, a plasma in the gas to be treated, the torch comprising an injector made of electrically conducting material mounted on a first large face of the waveguide structure and extending so as to project through an orifice made in a second large face opposite the said first large face, a gap for passage of the incident waves lying around the injector.

This device may include one or more of the following characteristics, taken separately or in any technically possible combination:

the device includes means for adjusting the axial position of the injector with respect to the waveguide structure;

the adjustment means are made in the form of a screwthread which is made on the external surface of the injector and engages with an internal thread made in the waveguide structure;

the injector has an approximately cylindrical outer part, the adjustment means are made in the form a doublering fitting fastened to the said first large face of the structure, the injector passing through the doublering fitting, and the said cylindrical part is clamped radially onto the said fitting;

the hollow waveguide structure has one end intended to be connected to the microwave generator, another or opposite end intended to be provided with impedance adjustment means forming a short circuit, and a region in which the means for making the gas flow and for conveying the microwave power to the end of the injector are provided;

the said region is a region of reduced cross section;

the region of reduced cross section has a part of constant cross section, in which the means for making the gas flow are provided, and the said region of reduced cross section lies between two parts of cross section increasingly linearly towards the two ends;

the said region is a region of constant cross section which lies between the said two ends, and the device furthermore includes an impedance matcher which converts the electromagnetic impedance of the injector/plasma system into the electromagnetic impedance characteristic of the waveguide structure;

the impedance matcher is a hollow cylinder made of a material which is a good electrical conductor, especially copper or brass, placed coaxially around the injector and extending from the second large face of the structure towards the said first large face;

the microwaves have a frequency of about 2.45 GHz and the hollow cylinder has a length of between 25 mm and 40 mm, preferably about 33 mm, and an external diameter of between 20 and 30 mm, preferably about 25 mm;

the gap is bounded by the orifice made in the said large face and the outer profile of the injector;

the device includes an annular disc mounted on the said second large face and having a central orifice which has a diameter smaller than the diameter of the orifice in the said second large face, the gap is bounded by the central orifice, and a spacer lies between the annular disc and the said second large face, away from the edge of the central orifice;

the edge of the orifice defining the gap is of rounded, especially semi-toric, shape;

the gap has a width of between 1 mm and 3 mm;

the hollow structure has, at at least one of its ends and preferably at both of them, a window made of dielectric material, especially Teflon®, which is transparent to microwave energy and isolates, in a substantially gastight manner, the internal volume of the hollow structure from the waveguide sections extending towards the microwave generator and towards the impedance adjustment means, respectively;

the device furthermore includes a treatment reactor mounted on the hollow waveguide structure and sitting over the free end of the injector;

the wall of the treatment reactor is cylindrical and provided with a cooling coil connected to a source of coolant;

the device furthermore includes means for pumping the atmosphere present in the treatment reactor;

the pumping means constitute means for adjusting the approximately laminar flow of the gases at the site of the plasma the reactor is provided with plasma ignition means;

the ignition means comprise a wire-like rod made of electrically conducting material, especially tungsten, extending towards the free end of the injector and connected to a low-frequency or radio-frequency highvoltage supply, and movement means for moving it closer to or further away from the vicinity of the free end;

the free end of the injector has a cylindrical or conical external overall shape; and the free end of the injector is provided with a projecting central element for centering the plasma with respect to the exit of the injector, orifices for passage of the gas lying on each side of this element.

BRIEF DESCRIPTION OF THE FIGURES OF THE DRAWINGS

Further features and advantages will become apparent from the following description, given solely by way of example, and with reference to the appended drawings in which.

DETAILED DESCRIPTION OF THE PREFERRED EMBODIMENTS OF THE INVENTION

Figure 1:
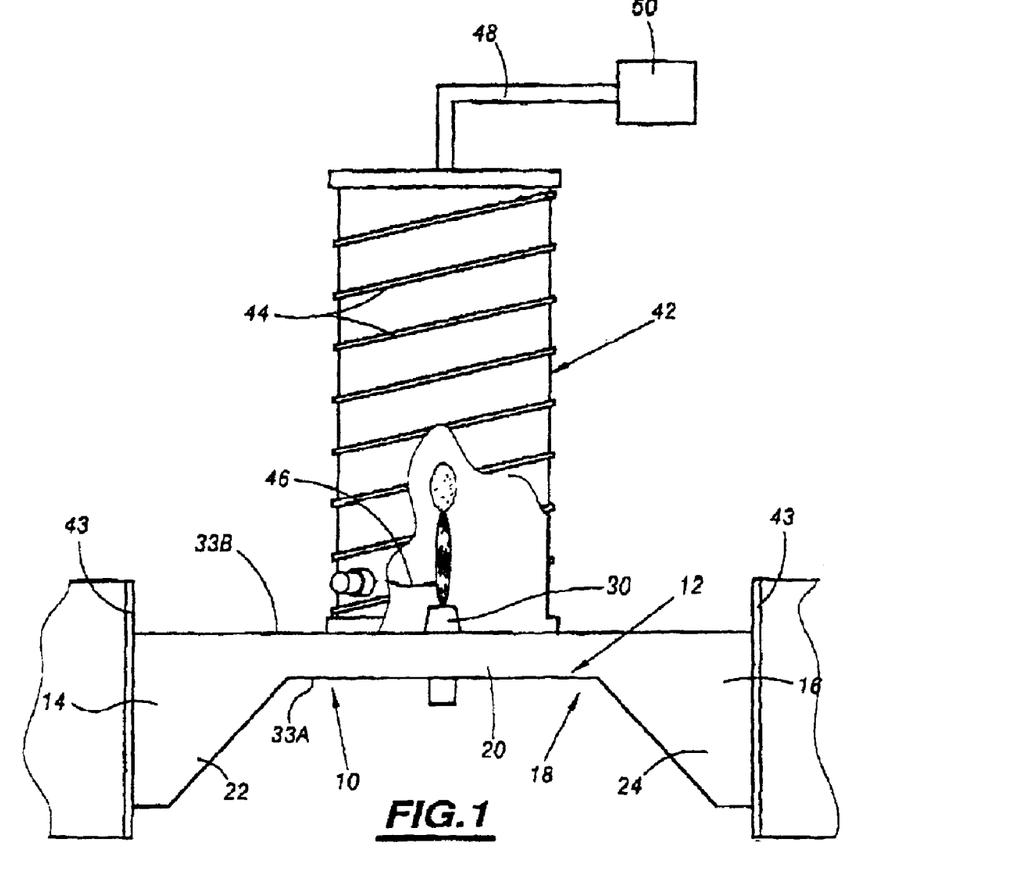
FIG. 1 is a schematic side view of a first embodiment of a gas treatment device according to the invention.
Figure 2:
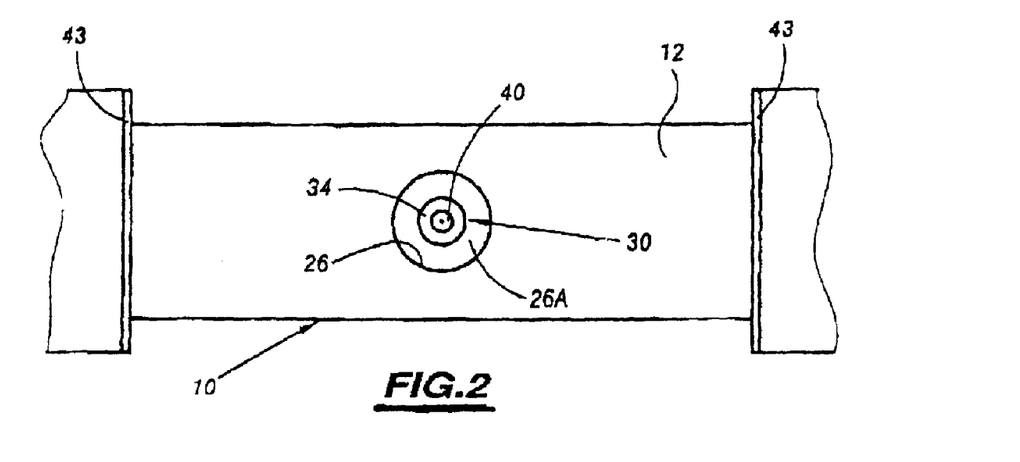
FIG. 2 is a top view of the device illustrated in FIG. 1.

FIGS. 1 and 2 show, schematically, a device for the plasma treatment of gases according to the invention, denoted by the overall numerical reference 10, seen from the side and from above, respectively.

The device 10 consists mainly of a hollow waveguide structure 12 of longitudinal shape and made of an electrically conducting material suitable for the envisaged use, particularly a metal. Preferably, it has a rectangular cross section and a plane of symmetry lying in the plane of FIG. 1, that is to say parallel to the small faces of the structure 12.

The structure 12 has two open ends 14 and 16, one intended to be connected to a microwave generator (not shown) and the other intended to be connected to means suitable for forming an adjustable short circuit, preferably a conducting plate placed transversely and longitudinally adjustable so that the impedance can be adjusted.

Between the two ends 14 and 16, the structure 12 has a region 18 of reduced cross section, concentrating the incident microwaves, which region 18 has a middle part 20 of constant cross section lying between two parts 22 and 24 of cross section increasingly linearly towards the ends 14 and 16.

Figure 3:
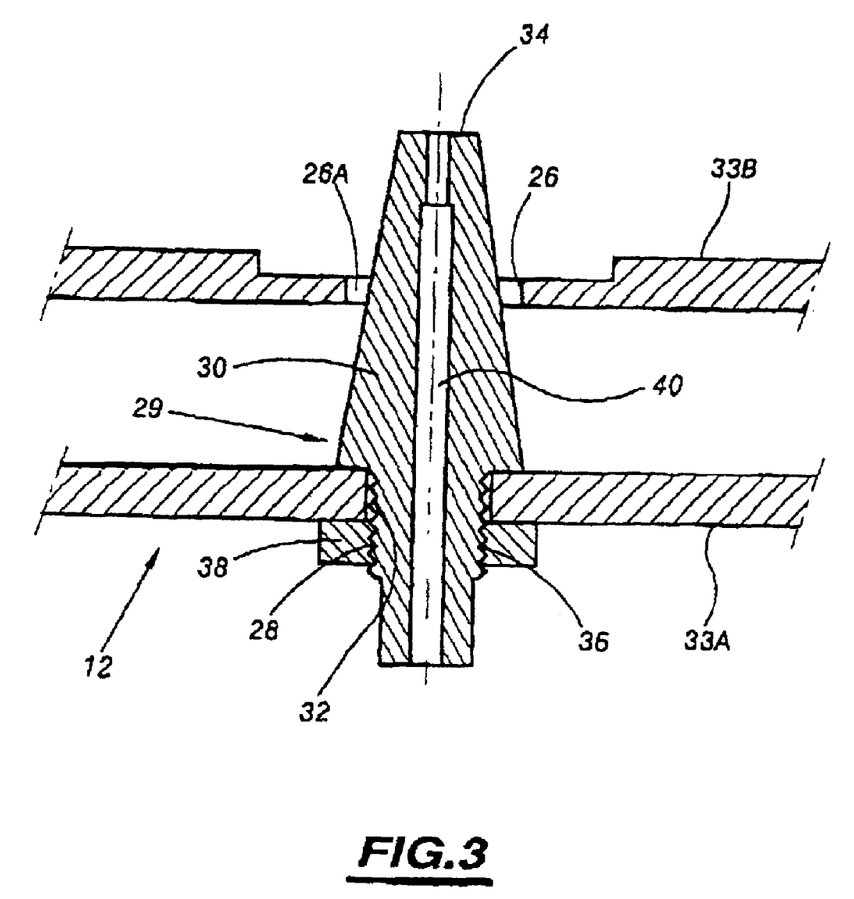
FIG. 3 is a cross-sectional view of part of the device illustrated in FIG. 1.
Figure 4:
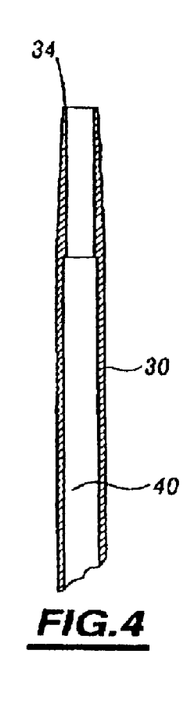
FIGS. 4 to 13 show various embodiments of the injector of the device illustrated in FIG. 1.

Referring also to FIG. 3, the constituent wall of the structure 12 has, in the middle part 20, two coaxial orifices 26 and 28, through which extend means for making a gas to be treated flow through the factor 12 and, in particular, through the latter in a region in which the amplitude of the electric field associated with the incident wave is high, and preferably a maximum.

The expression "high amplitude of the electric field" is understood to mean that the amplitude of the electric field is sufficiently high to allow the plasma to be ignited.

As may be seen in this FIG. 3, these means consist of a torch 29 supported by the waveguide and comprising an injector 30 having a proximal region 32 via which it is fixed to one of the large faces 33A of the structure 12 and a free distal end 34 which passes through the orifice 26 made in the opposite large face 33B of the structure 12 and via which it extends so as to project out of this structure 12.

The injector 30 has a cross section which narrows towards its free end 34 so that a gap 26A remains at the orifice 26, between the injector 30 and the constituent wall or face 33B of the structure 12, via which gap the incident waves pass along the wall of the injector 30 towards the free end 34.

In the illustrative example shown in these figures, the waveguide structure 12 has two coaxial orifices 26, 28 for mounting a single torch 29. It should be understood that a larger number of such orifices, arranged in pairs of coaxial orifices, may be provided in order to mount a corresponding number of plasma torches, in which case the pairs of coaxial orifices will in general be arranged so as, on the one hand, to ensure that the power is divided equally between each gap, so as to create approximately identical plasmas at the end of each torch, and, on the other hand, to achieve good impedance matching of the multi-torch structure using adjustment means which are also provided (for example, a conventional moveable short circuit and a conventional three-screw matcher), with a reflected power of preferably less than 1% of the incident power.

Moreover, the device 10 includes means for adjusting the axial position of the injector 30 with respect to the structure 12, being in the form of a screwthread 36 made in the external peripheral surface of the proximal region 32 of the injector and engaging with an internal thread of a nut 38 carried by the structure 12. The distance between the free end 34 of the torch and the corresponding large face 33B of the structure 12 can thus be accurately adjusted.

The injector 30 has an internal duct 40 through which the gas to be treated flows, this duct being connected to a source (not shown) for supplying the gas to be treated.

As a variant, the injector 30 has a base consisting of a cylindrical tubular portion extended by a nozzle of cylindrical or conical external overall shape (FIGS. 4 to 12 and FIG. 19). The diameter of the circular orifice 26 made in the large face of the guide is suitable for making the circular gap 26A have a width small enough for the microwave power to be conducted out of the guide towards the tip of the nozzle. The width is large enough to prevent the risk of arc generation between the injector 30 and the waveguide.

The width of the gap 26A is, for example, between 1 mm and 3 mm.

The device 10 includes a treatment reactor 42 mounted on the structure 12 in its middle region 20 so as to sit over the injector 30 of the torch so that the latter discharges into the reactor 42.

It should be noted that the reactor 42 is mounted on the structure 12 in a sealed manner and connects with the internal volume of said structure via the circular gap 26A bounded by the injector 30 and the orifice 26.

The ends 14, 16 of the structure are closed in a gas-tight manner by two plates 43 which are made of a dielectric material, preferably Teflon®, and are transparent to microwave energy. These two plates 43 thus form "windows" for the microwaves, while the corrosive or harmful gas possibly present in the structure 12 and coming from the reactor 42 cannot flow into the surroundings or into the microwave generator 60.

The wall of the reactor 42 is cylindrical and is provided with cooling means, these being in the form of a coil 44 connected to a source (not shown) of suitable coolant.

It also has a plasma ignition member made in the form of a conducting wire-like rod 46, for example made of tungsten, extending towards the free end 34 of the injector of the torch and connected to a low-frequency or radio-frequency high-voltage supply (not shown). This rod 46 is provided with movement means (not shown) allowing it to be moved away from the vicinity of the free end 34 once the discharge has been ignited.

A pipe 48 is connected to the reactor 42 for collecting the gases after they have passed through the plasma, which pipe in the present example is provided with means 50 for pumping the atmosphere present in the reactor.

As will have been understood, the reactor 42 makes it possible to isolate from the external environment the gases leaving the torch 29 and to collect them in their entirety for the next part of the treatment process.

The dimensions of the chamber of the reactor 42 must be large enough not to disturb the conditions for sustaining a desirably stable and symmetrical plasma, either by stray coupling of the microwave energy into the walls of the chamber or by degradation of the gas flow conditions near the torch 29. However, the dimensions of the chamber of the reactor 42 must be small enough in order to keep the entire device compact.

For example, the reactor 42 consists of an aluminium cylinder approximately 200 mm in diameter and 480 mm in height.

In this case, the pumping means 50 must in general be used to maintain the gas flow conditions close to laminar conditions at the point where the plasma flame is.

Of course, larger dimensions may be used if the increased size of the overall device is not an unacceptable drawback.

Thus, if a large reactor is used, the cooling means may be omitted.

Referring to FIGS. 4 to 13, the free end of the injector 30 of the plasma torch may have various configurations.

Figure 5:
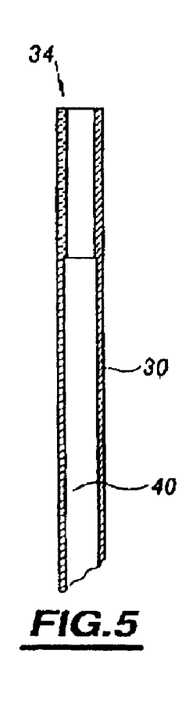
Figure 6:
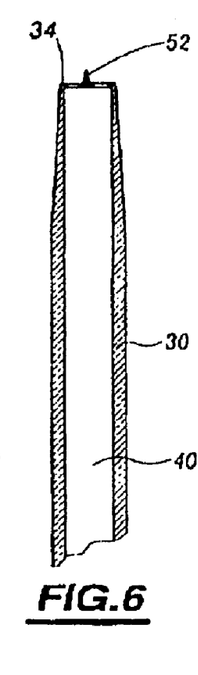
Figure 7:
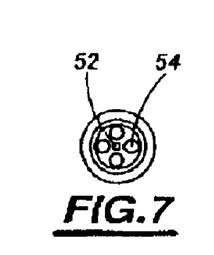
Figure 8:
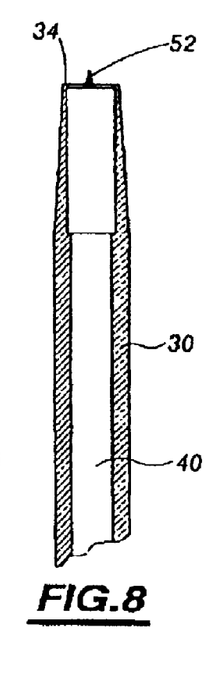
Figure 9:
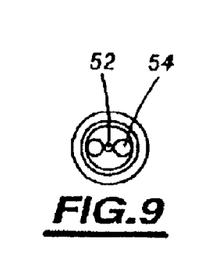
Figure 10:
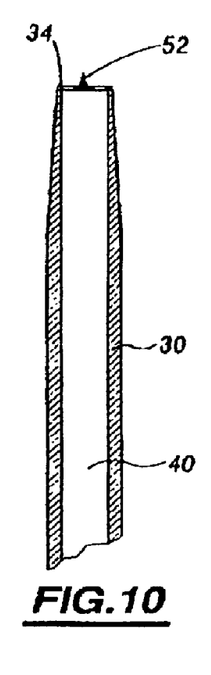
Figure 11:
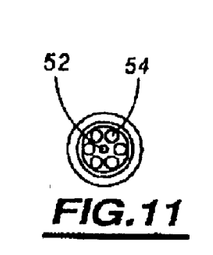

Whereas in the illustrative example described schematically with reference to FIGS. 1 to 3 the injector has a conical external shape, it may also have a cylindrical external shape, as shown in FIG. 5.

The free end of the nozzle has a diameter of between 4 and 4.8 mm, preferably equal to 4 mm.

For a larger diameter, the efficiency of the treatment suffers to the extent that the plasma column does not cover the entire opening.

For smaller diameter values, the resulting increase in the velocity of the gas to be treated reduces the residence time of its species in the plasma and therefore the degree of destruction.

It should be noted that, for an injector 30 having a single opening, the plasma is ignited in a circumferential region and is therefore placed eccentrically with respect to the stream of gas.

As may be seen in the examples shown in FIGS. 6 to 11, the free end of the injector is provided with a central tip 52 forcing the plasma to be constrained along the axis of the nozzle, at the center of the gas stream.

In this case, the free end 34 of the injector has a number of orifices for passage of the gas, such as 54, these being uniformly distributed around the central tip 52, for example two, four or six orifices (FIGS. 7, 9 and 11) in order to form an injector of the "shower head" type.

Figure 12:
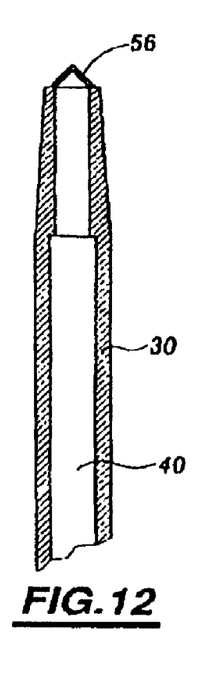
Figure 13:
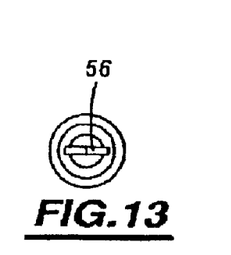

As a variant, shown in FIGS. 12 and 13, the central tip 52 is replaced by a bridge-forming tip 56 mounted on the free end 31 of the injector.

A gas treatment plant using the device that has just been described will now be described with reference to FIG. 14.

Figure 14:
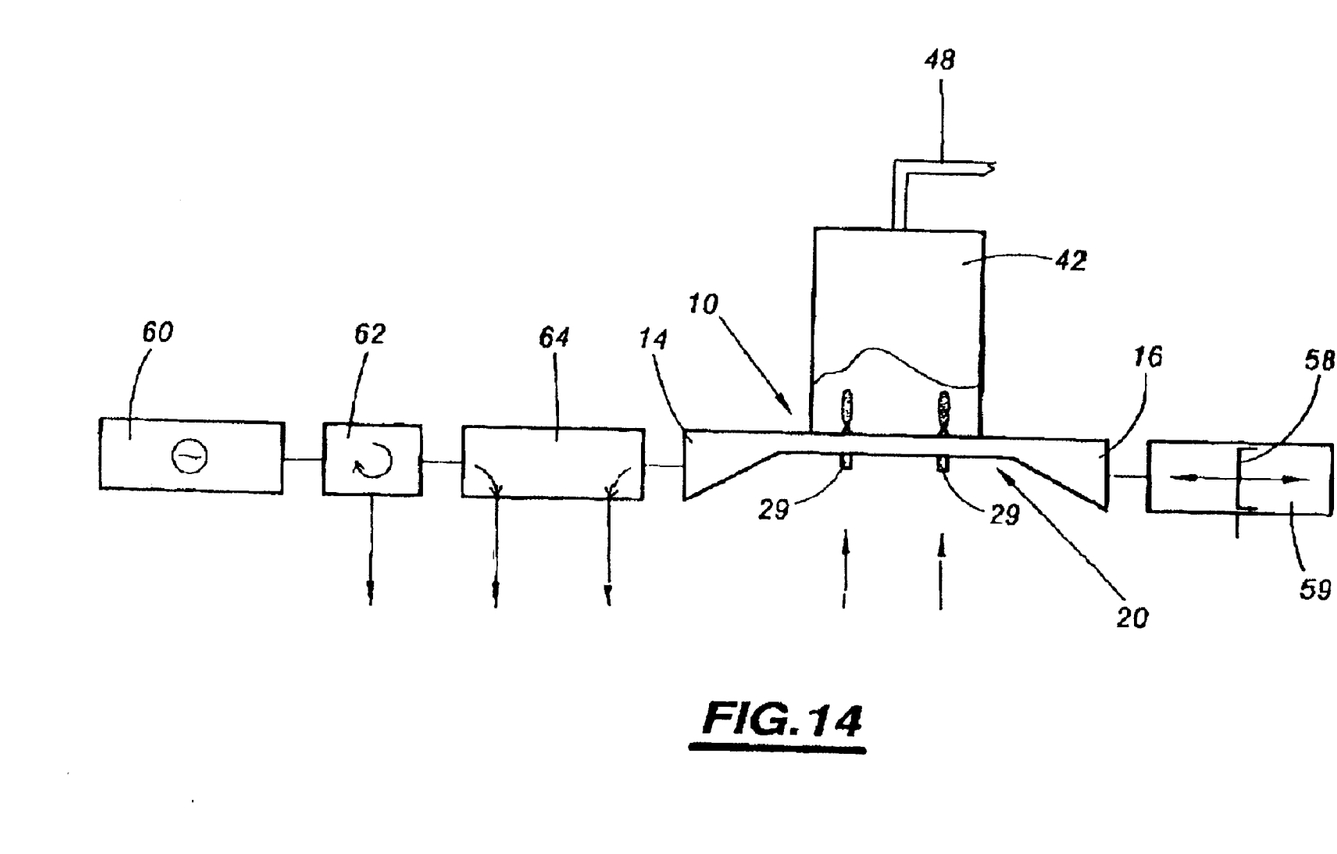
FIG. 14 is a gas treatment plant using a treatment device according to the invention.

As this FIG. 14 shows, the device 10 has two torches 29 surrounded by a single reactor 42 into which a gas-collecting pipe 48 runs.

As a variant, it is obviously possible to arrange for there to be one reactor for each individual torch.

One of the free ends 16 of the waveguide structure 12 is provided with a terminal plate forming a movable impedance-adjusting short circuit 58 and connected to a device 59 for adjusting its position in the structure 12.

The opposite end 14 is connected to a power generator 60 which generates the incident microwaves by means of a circulator 62, of conventional type, and optional, ensuring that the generator is protected from any power reflected by the torches 29 when the plasma is ignited, or when the impedance tuning is poor or during adjustment. The circulator 62 has the function of transferring the reflected power to a device (not shown) suitable for absorbing this power, for example a device provided with a water charge.

Directional couplers 64 are also interposed between the circulator 62 and the device 10 so as to take off a defined fraction of the power passing through the waveguide, so as to determine its value.

The plant is completed by means (not shown) for supplying the device 10 with gas to be treated, these means being connected to the torches 29.

An example of the application of the treatment device that has just been described to the destruction of $C_2F_6$ will now be described with reference to FIGS. 15 to 17.

The incident microwaves have a frequency of 2.45 gigahertz. The movable short circuit 58 mounted on the free end 16 of the structure 12 is adjusted so as to optimize the impedance tuning and to minimize the reflected power.

It has been found that, with the waveguide torch device according to the invention, a very low value of the power reflected to the generator can be obtained after adjusting the movable short circuit 58. optionally, a three-screw impedance matcher (not shown) may be fitted onto the waveguide on the same side as the microwave power inlet, between the directional couplers 64 and the device 14, so as to improve the adjustment.

Figure 15:
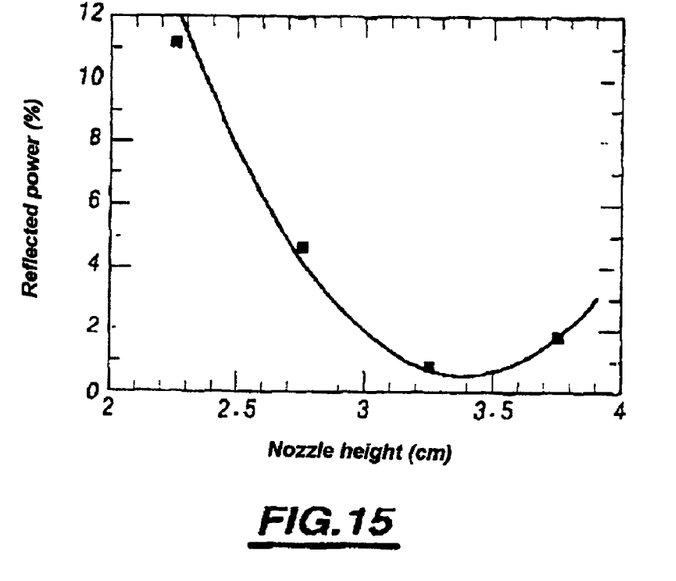
FIG. 15 is a curve showing the variation in power reflected in the waveguide as a function of the height of the injector.

Moreover, as may be seen in FIG. 15, adjusting the position of the height of the injector 30 with respect to the upper surface of the face 33B constitutes a very fine adjustment means and makes it possible to minimize the reflected power. In this present example, the height may be between 2.8 cm and 4.1 cm and is preferably 3.4 cm.

The pressure inside the reactor 42 is adjusted using the pumping means 50 (FIG. 1) so as to prevent the development of an electrical arc between the nozzle of the torch 29 and the wall of the reactor 42 and so as to obtain a stable plasma, for a given microwave power range.

It should be noted that if the pressure inside the reactor 42 is lowered, the power of the incident microwaves has to be reduced correspondingly in order to maintain acceptable plasma stability.

Figure 16:
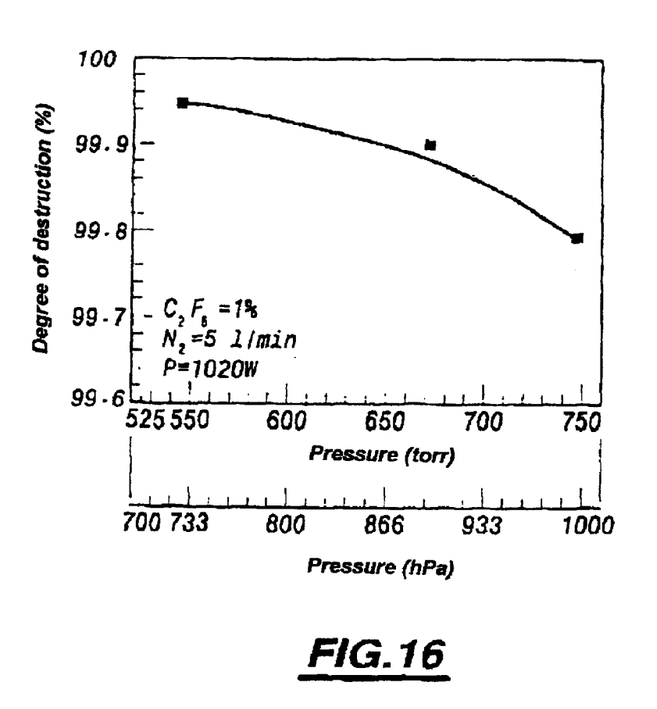
FIG. 16 is a curve showing the degree of destruction of a gas by means of the device illustrated in FIG. 1 as a function of the pressure inside the reactor.

With reference to FIG. 16, it may be seen that the pressure in the reactor 42 also has an influence on the degree of destruction of $C_2F_6$.

Thus, in order to maintain acceptable plasma stability, to prevent the risks of arcs appearing and to be able to maintain a sufficient power level to achieve the desired degree of destruction, the device preferably works at pressures of between 800 hPa (600 torr) and 866 hPa (650 torr).

Figure 17:
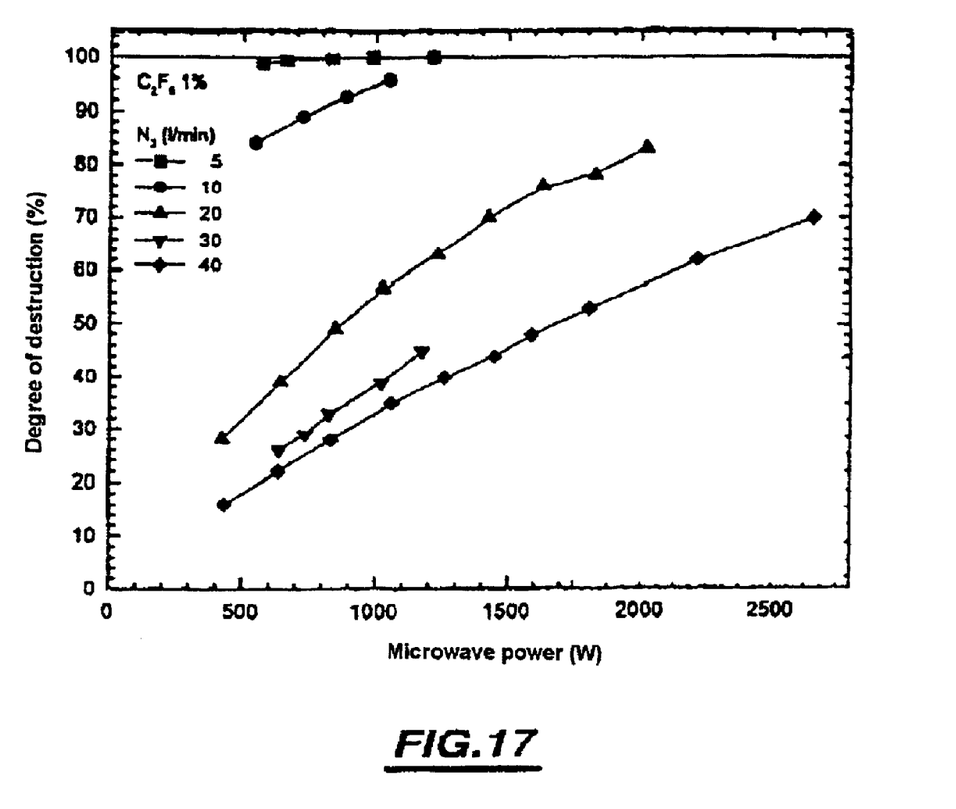
FIG. 17 is a curve showing the variation in the degree of destruction on a gas as a function of the incident microwave power for various gas flow rates, the dilution of the gas being 1%.

FIG. 17 shows a curve illustrating the variation in the degree of destruction of $C_2F_6$ as a function of the incident microwave power, for $C_2F_6$ diluted to 1% in nitrogen, and for various nitrogen flow rates. It may be seen that, for a low flow rate (5.0 liters per minute), the degree of destruction easily reaches 100% for a moderate power (1200 watts). On the other hand, when the nitrogen flow rate is increased to 40.0 liters per minute, even using two torches, the degree of destruction for a comparable power is no more than about 40%. In order to bring the degree of destruction back to 70%, a power of 2800 watts must be achieved.

It will be immediately understood from the foregoing that the operating conditions of the device described with reference to FIGS. 1 to 13 may be adapted so as to obtain a degree of $C_2F_6$ destruction close to 100% by varying the flow rate and the absorbed microwave power. These results are not affected by the generation of solid materials resulting from the decomposition of the gases treated, in so far as the plasma is produced in the reactor 42 downstream of the torch 29 and not in the duct for supplying the device with the gas to be treated.

The solid residues are therefore not liable to block this duct or to modify its internal geometry. They may furthermore be easily recovered in that these decomposition products build up in the bottom of the reactor 42.

Furthermore, these performance characteristics are obtained by means of a gas treatment device according to the invention which is of simple structure, and is therefore inexpensive, in so far as the means for applying the electric field associated with the incident electromagnetic wave are greatly simplified compared with those with which plasma torches are generally equipped, while still being very efficient.

Figure 18:
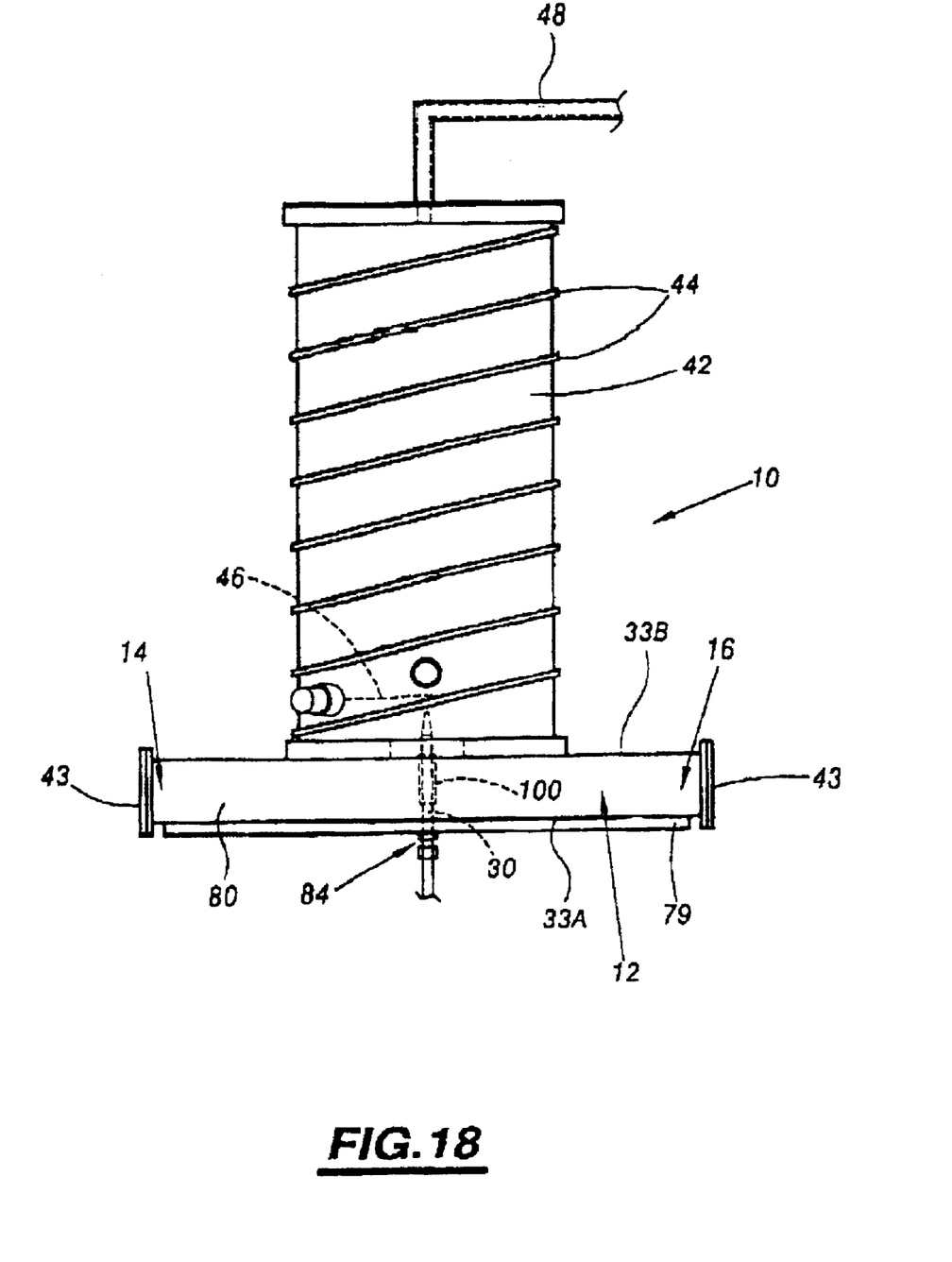
FIG. 18 is a schematic side view of a second embodiment of a gas treatment device according to the invention.
Figure 19:
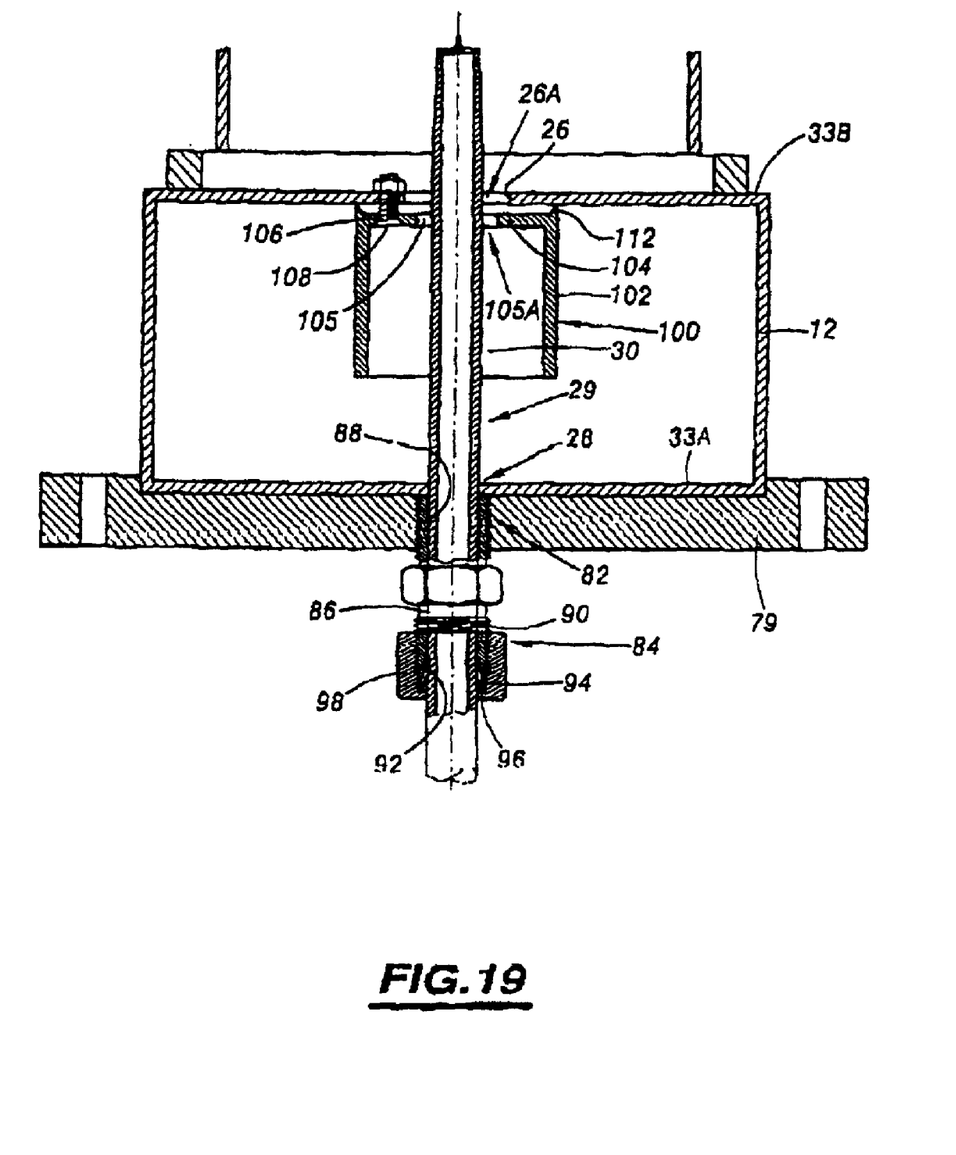
FIG. 19 is a cross-sectional view on the line XIX—XIX illustrated in FIG. 18.

FIGS. 18 and 19 show a second embodiment of a device according to the invention. In the following, only the differences with respect to the first embodiment will be described. Elements similar to those in the first embodiment bear identical reference numbers.

This device 10 has a hollow structure 12 supported by a support plate 79. The hollow structure has a region 80 of identical cross section over its entire length between the two ends 14, 16.

The support plate 79 has an internal thread 82 coaxial with the two orifices 26, 28 of the hollow structure 12.

A double-ring fitting 84 is screwed into this internal thread 82 and extends from the opposite side of the plate 79 from the hollow structure 12. This fitting 84 is known per se and is sold, for example, under the name "Swagelok®".

This fitting 84 comprises a base body 86 having substantially the shape of a hollow cylinder.

The base body 86 has an external thread 88 via which it is fastened into the internal thread 82. The base body 86 has, on the opposite side to the support plate 79, an external thread 90 and a conical inner surface 92 which narrows down towards the support.

The device 84 furthermore includes two rings 94, 96 of frustoconical shape which are placed coaxially one with respect to the other and with respect to the base body 86. The frustoconical surface of the first ring 94 is applied against the frustoconical surface 92 of the base body 86.

A lock nut 98 is screwed onto the external thread 90 and grips the first ring 94 between the second ring 96 and the base body 86.

The injector 30 has a cylindrical part and extends through the nut 98, the two rings 94, 96 and the base body 86. The injector 30 is fastened axially by radially clamping the first ring 94 against a cylindrical part of the injector 30.

It is thus possible to continuously adjust the height of the injector 30 with respect to the face 33B of the hollow structure 12.

The device 10 furthermore includes an impedance transformer 100 fastened to the inner surface of the opposite face 33B of the hollow structure 12.

The impedance transformer 100 is essentially a hollow cylinder 102 placed coaxially around the torch 29.

The end 102 of this hollow cylinder which is adjacent to the opposite face 33B has an annular disc-shaped fastening base 104 in which there is a central orifice 105 for passage of the injector 30. Three fastening holes 106 (one of which is visible) are made in the base 104 and are distributed uniformly around the axis of the cylinder. The impedance transformer 100 is fastened to the hollow structure 12 by means of three screws 108.

It should be noted that the central orifice 105 in the base 104 has a slightly smaller diameter than the diameter of the hole 26 in the structure 12.

Thus, the two orifices 26, 105 are decoupled from the electromagnetic standpoint and the transfer of the microwave power towards the end 34 of the injector 30 is, at the location of the orifices 26, 105, substantially determined by the gap 105A between the orifice 105 and the injector 30. The edge of the central orifice 105 has a rounded, especially semi-toric shape so as to reduce the risk of generating arcs between the edge and the injector 30.

The fastening base 104 furthermore has a circular axial rim 112 on its face turned towards the opposite face 33B of the hollow structure 12. The rim 112 has approximately the same diameter as the fastening base 104. This rim 112 forms a spacer keeping the fastening base 104 away from the opposite face 33B and thus decoupling the impedance transformer 100 from the hollow structure 12 with regard to the microwave energy.

In this way, the transfer of the microwave power to the point of discharge is determined mainly by the impedance transformer 100.

The dimensions of the impedance transformer are chosen so that the electromagnetic impedance of the injector 30 is approximately the characteristic electromagnetic impedance of the hollow structure 12.

The impedance transformer is made, for example, of copper or brass, but it may be made of any material which is a good electrical conductor. For a microwave frequency of 2.45 GHz, the preferred dimensions of the transformer are as follows: the length is between 30 and 40 mm and is preferably 33 mm, and the external diameter is between 20 mm and 30 mm and is preferably 25 mm.

The operation of the device according to the second embodiment is similar to the operation of the device according to the first embodiment.

The second embodiment of the device according to the invention has a particularly simple structure and a low manufacturing cost.

While the invention has been described with preferred embodiments, it is to be understood that variations and modifications may be resorted to as will be apparent to those skilled in the art. Such variations and modifications are to be considered within the purview and the scope of the claims appended hereto.

What is claimed is:

1. Device for the plasma treatment of gases, comprising
   a hollow structure forming a waveguide intended to be connected to a microwave generator, and
   means for making the gas to be treated flow through the said structure in a region in which the amplitude of the electric field associated with the incident wave is high and preferably a maximum, with the means for making the gas flow comprising
      at least one plasma torch for producing at the exit thereof a plasma in the gas to be treated, the torch comprising an injector made of electrically conducting material fixed to a first face of the waveguide structure and extending through an orifice in a second face opposite the said first face, and
      a gap for passage of the incident waves lying around the injector.

2. The device according to claim 1, further comprising means for adjusting the axial position of the injector with respect to the waveguide structure.

3. The device according to claim 2, wherein the adjustment means are in the form of a screwthread on the external surface of the injector and engages with an internal thread in the waveguide structure.

4. The device according to claim 2, wherein the injector has an approximately cylindrical outer part,
   in that the adjustment means are in the form of a double-ring fitting fastened to said first face of the structure, the injector passing through the double-ring fitting, and
   in that the cylindrical part is clamped radially onto said fitting.

5. The device according to claim 2, wherein the hollow waveguide structure has one end intended to be connected to the microwave generator, another or opposite end intended to be provided with impedance adjustment means forming a short circuit, and a region in which means for making the gas flow and for conveying microwave power to the end of the injector are provided.

6. The device according to claim 5, wherein said region is a region of reduced cross section.

7. The device according to claim 6, wherein said region of reduced cross section has a part of constant cross section in which the means for making the gas flow are provided and in that said region of reduced cross section lies between two parts of cross section increasing linearly towards the two ends.

8. The device according to claim 5, wherein said region is a region of constant cross section which lies between the two ends and in that the device furthermore includes an impedance matcher which converts the electromagnetic impedance of the injector/plasma system into the electromagnetic impedance characteristic of the waveguide structure.

9. The device according to claim 8, wherein the impedance matcher is a hollow cylinder made of a material which is a good electrical conductor, especially copper or brass, placed coaxially around the injector and extending from the second face of the structure towards the first face.

10. The device according to claim 2, wherein the gap is bounded by the orifice made in the second face and the outer profile of the injector.

11. The device according to claim 2, wherein it includes an annular disc mounted on the second face and has a central orifice which has a diameter smaller than the diameter of the orifice in the second face, and that the gap is bounded by the central orifice and a spacer lies between the annular disc and the second face away from the edge of the central orifice.

12. The device according to claim 1, wherein the hollow waveguide structure has one end intended to be connected to the microwave generator, another or opposite end intended to be provided with impedance adjustment means forming a short circuit, and a region in which means for making the gas flow and for conveying microwave power to the end of the injector are provided.

13. The device according to claim 12, wherein said region is a region of reduced cross section.

14. The device according to claim 13, wherein said region of reduced cross section has a part of constant cross section in which the means for making the gas flow are provided and in that said region of reduced cross section lies between two parts of cross section increasing linearly towards the two ends.

15. The device according to claim 12, wherein said region is a region of constant cross section which lies between the two ends and in that the device furthermore includes an impedance matcher which converts the electromagnetic impedance of the injector/plasma system into the electromagnetic impedance characteristic of the waveguide structure.

16. The device according to claim 15, wherein the impedance matcher is a hollow cylinder made of a material which is a good electrical conductor, especially copper or brass, placed coaxially around the injector and extending from the second face of the structure towards the first face.

17. The device according to claim 16, wherein the microwaves have a frequency of about 2.45 GHz and in that the hollow cylinder has a length of between 25 mm and 40 mm, and an external diameter of between 20 and 30 mm.

18. The device according to claim 17, wherein the hollow cylinder has a length of about 33 mm.

19. The device according to claim 17, wherein the external diameter of the hollow cylinder is about 25 mm.

20. The device according to claim 12, wherein the hollow structure has at least one of its ends a window made of dielectric material which is transparent to microwave energy and isolates, in a substantially gas-tight manner, the internal volume of the hollow structure from the waveguide sections extending towards the microwave generator and towards the impedance adjustment means, respectively.

21. The device according to claim 20, wherein the hollow structure has at both of its ends a window made of dielectric material which is transparent to microwave energy and isolates, in a substantially gas-tight manner, the internal volume of the hollow structure from the waveguide sections extending towards the microwave generator and towards the impedance adjustment means, respectively.

22. The device according to claim 1, wherein the gap is bounded by the orifice made in the second face and the outer profile of the injector.

23. The device according to claim 22, wherein the edge of the orifice defining the gap is of rounded shape.

24. The device according to claim 22, wherein the edge of the orifice defining the gap is of semi-toric shape.

25. The device according to claim 1, wherein it includes an annular disc mounted on the second face and has a central orifice which has a diameter smaller than the diameter of the orifice in the second face, and that the gap is bounded by the central orifice and a spacer lies between the annular disc and the second face away from the edge of the central orifice.

26. The device according to claim 25, wherein the edge of the orifice defining the gap is of rounded shape.

27. The device according to claim 25, wherein the edge of the orifice defining the gap is of semi-toric shape.

28. The device according to claim 1, wherein the gap has a width of between 1 mm and 3 mm.

29. The device according to claim 1, wherein it further comprises a treatment reactor mounted on the hollow waveguide structure sitting over the free end of the injector.

30. The device according to claim 29, wherein the wall of the treatment reactor is cylindrical and provided with a cooling coil connected to a source of coolant.

31. The device according to claim 30, wherein the reactor is provided with plasma ignition means.

32. The device according to claim 31, wherein the ignition means comprise a wire-like rod made of electrically conducting material extending towards the free end of the injector and connected to a low-frequency or radio-frequency high-voltage supply, and movement means for moving it closer to or further away from the vicinity of the free end.

33. The device according to claim 29, wherein it further comprises means for pumping the atmosphere present in the treatment reactor.

34. The device according to claim 33, wherein the pumping means constitute means for adjusting the approximately laminar flow of the gases at the site of the plasma.

35. The device according to claim 34, wherein the reactor is provided with plasma ignition means.

36. The device according to claim 33, wherein the reactor is provided with plasma ignition means.

37. The device according to claim 1, wherein the free end of the injector has a cylindrical or conical external overall shape.

38. The device according to claim 37, wherein the free end of the injector is provided with a projecting central element for centering the plasma with respect to the exit of the injector, orifices for passage of the gas lying on each side of this element.

* * * * *